United States Patent
Kitao et al.

(10) Patent No.: US 7,229,916 B2
(45) Date of Patent: Jun. 12, 2007

(54) METHOD OF MANUFACTURING A SEMICONDUCTOR DEVICE

(75) Inventors: Ryohei Kitao, Kanagawa (JP); Koji Arita, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 222 days.

(21) Appl. No.: 10/892,352

(22) Filed: Jul. 16, 2004

(65) Prior Publication Data

US 2005/0048769 A1 Mar. 3, 2005

(30) Foreign Application Priority Data

Jul. 18, 2003 (JP) ............................ 2003-276697

(51) Int. Cl.
*H01L 21/4763* (2006.01)
(52) U.S. Cl. .............................. 438/637; 257/E21.175; 257/E21.585; 205/157
(58) Field of Classification Search ................ 438/597, 438/637, 672; 205/157, 261

See application file for complete search history.

(56) References Cited

U.S. PATENT DOCUMENTS 6,207,222 B1 * 3/2001 Chen et al. ................. 205/123
6,797,144 B2 * 9/2004 Su et al. ..................... 205/157
2002/0011415 A1 * 1/2002 Hey et al. .................... 205/104

FOREIGN PATENT DOCUMENTS

JP 11-97391 4/1999

* cited by examiner

*Primary Examiner*—Alexander Ghyka
(74) *Attorney, Agent, or Firm*—Young & Thompson

(57) ABSTRACT

A method of manufacturing a semiconductor device is to be provided, which improves filling performance of a conductive layer to be formed by an electrolytic plating process in an interconnect trench or a via hole, and achieves a higher in-plane uniformity in bottom-up performance. An electrolytic plating process to fill with a conductive layer at least one of an interconnect trench and a via hole formed in a dielectric layer on a semiconductor substrate includes a first step of executing a plating operation under a predetermined integrated current density, which is a product of a current density representing a current value supplied per unit area of a plating solution containing a material which constitutes the conductive layer and a plating time, and a second step of executing a plating operation under a lower current density than that of the first step.

6 Claims, 14 Drawing Sheets

PRIOR ART

PRIOR ART b/a = BOTTOM-UP RATIO

PRIOR ART

METHOD OF MANUFACTURING A SEMICONDUCTOR DEVICE

This application is based on Japanese patent application No. 2003-276697, the content of which is incorporated hereinto by reference.

BACKGROUND OF THE INVENTION

1. Field of the Invention

The present invention relates to a method of manufacturing a semiconductor device provided with at least one of a via and an interconnect.

2. Description of the Related Art

Semiconductor devices currently available are generally provided with semiconductor elements such as a transistor, a resistance, a capacitance and soon formed on a semiconductor substrate, an interconnect formed among dielectric layers on the semiconductor element, and a via which connects the semiconductor element and the interconnect.

FIG. 10 is a schematic cross-sectional view showing a constitution of a semiconductor device. Here, a constitution of a semiconductor element is not shown in the drawing.

As shown in FIG. 10, the semiconductor device is provided with a first interconnect 114 formed on an underlying dielectric layer 110 provided on a semiconductor substrate 100, a second interconnect 136 isolated from the first interconnect 114 by an interlayer dielectric layer, and a via 134 which electrically connects the first interconnect 114 and the second interconnect 136.

The first interconnect 114 is formed in a first etch-stopper layer 112 and a first interlayer dielectric layer 113. The via 134 is disposed in a second etch-stopper layer 116 and a second interlayer dielectric layer 118. The second interconnect 136 is formed in a third etch-stopper layer 138 and a third interlayer dielectric layer 140.

An upper face of the second interconnect 136 is covered with a metal diffusion barrier 142 which prevents diffusion of a metal contained in the interconnect. Over the second interconnect 136, a bonding pad (not shown in the drawings) for electrical connection to outside the semiconductor device and a protection layer 144 for preventing intrusion of moisture are provided.

To form the interconnect and the via the Damascene process is known, which includes filling an interconnect trench or a via hole with a conductive layer containing a metal such as copper (Cu), and scraping an excessive portion of the conductive layer by a CMP (Chemical Mechanical Polishing) process. In the Damascene process, an electrolytic plating process may be employed for filling an interconnect trench or a via hole with a conductive layer, as disclosed in JP-A Laid Open No. 1999-097391. The electrolytic plating process will be described below.

FIG. 11 is a block diagram showing a constitution of an electrolytic plating apparatus employed for the electrolytic plating process. In the subsequent passages, not only an independent piece of semiconductor substrate constituted of silicon or gallium arsenide, but also a semiconductor substrate on which a semiconductor element or an interconnect is formed will be collectively defined as a wafer. Also, the electrolytic plating apparatus will be employed to form a copper layer.

As shown in FIG. 11, the electrolytic plating apparatus is provided with a wafer holder 12 for holding a wafer W to be plated, a plating bath 14 in which a plating solution D is deposited, an anode 16 set so as to confront the wafer W which acts as a cathode, a power unit 18 for supplying a current between the wafer W and the anode 16, a voltmeter/ammeter 20 for measuring a voltage and a current between the wafer W and the anode 16, and a control unit 22 which controls a current to be supplied between the wafer W and the anode 16 as well as a voltage to be applied between the wafer W and the anode 16. The electrolytic plating apparatus is also provided with a carrier robot (not shown in the drawings), which attaches the wafer W to the wafer holder 12 and dips it in the plating solution D, and then removes the wafer W from the wafer holder 12 after completion of the plating process. The plating solution D is, for example, copper sulfate containing a trace of additive.

The wafer to be plated is provided with a barrier metal layer and a copper seed layer, formed in this sequence on a predetermined opening pattern on a dielectric layer surface. When an operator places such wafer W on a designated inlet/outlet gate, the carrier robot (not shown in the drawings) of the electrolytic plating apparatus attaches the wafer W to the wafer holder 12 and dips it in the plating solution D. Thereafter, the control unit 22 monitors a value of the voltmeter/ammeter 20 to control the power unit 18 such that a predetermined current is supplied between the wafer W and the anode 16, by which a copper-plated layer is formed on the opening pattern.

A method of manufacturing the above semiconductor device will be described.

FIGS. 12A to 12C and 13D to 13F are schematic cross-sectional views progressively showing a method of manufacturing the semiconductor device. Here, it is to be construed that the semiconductor substrate is provided with semiconductor elements though they are not shown in the drawings, and such elements will not be particularly referred to in the following description.

After forming a semiconductor element (not shown in the drawings) on the semiconductor substrate 100 shown in FIG. 10, the underlying dielectric layer 110 is formed. The first etch-stopper layer 112 and the first interlayer dielectric layer 113 for insulating the first interconnect 114 are formed on the underlying dielectric layer 110. Then a known lithography and etching process is carried out to form a predetermined first trench pattern in the first etch-stopper layer 112 and the first interlayer dielectric layer 113, after which the first trench pattern is filled with a conductive layer, and the first interconnect 114 is formed through the Damascene process. Thereafter, a second etch-stopper layer 116 is formed over an upper face of the first interconnect 114, and then the second interlayer dielectric layer 118 and an anti-reflection layer 120 are sequentially formed. Then a known lithography process is carried out to form a resist 124 having a via hole pattern 122 (FIG. 12A).

Referring to FIG. 12B, anisotropic etching is performed to remove a portion of the anti-reflection layer 120, the second interlayer dielectric layer 118 and the second etch-stopper layer 116 that is not covered with the resist 124, to thereby form a via hole 126. Thereafter the resist 124 and the anti-reflection layer 120 are removed by ashing and a stripper.

Then referring to FIG. 12C, a barrier metal layer 130 containing tantalum is formed on an upper face of the second interlayer dielectric layer 118 and on the via hole 126 to prevent diffusion of copper. After that, a copper seed layer 132 is formed as a base of plating growth of copper. Then the wafer W is loaded on the electrolytic plating apparatus shown in FIG. 11, and a current of a predetermined current density is supplied between the wafer W and the anode 16 so that the plating process is performed.

FIG. 14 is a graph showing a current supplied between the wafer and the anode during the electrolytic plating process. The horizontal axis represents a duration of plating time after starting the process, and the vertical axis represents a current value.

As shown in FIG. 14, upon starting the electrolytic plating process, current of a constant value is supplied for a predetermined duration of time for forming the copper-plated layer. The current value in this case is approx. 1.0 to 5.0 ampere.

Through such plating process, a copper layer 133, in which the copper seed layer 132 has been merged, is formed as shown in FIG. 13D. Then a CMP process is performed to polish the copper layer 133 and the barrier metal layer 130 until an upper face of the second interlayer dielectric layer 118 is exposed, to thereby form a via 134. Thereafter a third etch-stopper layer 138 is formed to cover an upper face of the via 134, and a third interlayer dielectric layer 140 is formed (FIG. 13E).

Referring to FIG. 13F, the Damascene process is carried out as with the first interconnect 114, to form a second interconnect 136 constituted of a conductive layer filled in a predetermined second trench pattern formed on the third etch-stopper layer 138 and the third interlayer dielectric layer 140. Then a metal diffusion barrier 142 is formed over the second interconnect 136, after which a bonding pad (not shown in the drawings) is formed and then the protection layer 144 shown in FIG. 10 is formed.

According to such method of forming a copper-plated layer in a via hole, a cathode-side voltage is applied to an edge of the wafer that is in contact with the wafer holder 12. Accordingly, a voltage difference emerges between a border region and a central region of the wafer because of a resistance existing on the way from the edge to the center of the wafer, resulting in a lower bottom-up performance (degree of growth of copper from a bottom portion of a via hole) in a central portion compared with an border region. This may lead to defective filling of a copper layer in a via hole. Hereunder, description about the bottom-up performance will be given.

FIG. 15 is a schematic cross-sectional view showing a via hole for explaining the bottom-up performance.

When forming a copper-plated layer by an electrolytic plating process on a wafer having a barrier metal layer and a seed layer provided after forming a via hole 152 in a dielectric layer 150, a formation rate of the copper-plated layer is different between a bottom portion of the via hole 152 and an upper face of the dielectric layer 150. Referring to FIG. 15, when "a" stands for a formation rate of the copper layer at an upper face of the dielectric layer 150 and "b" that at a bottom portion of the via hole 152, a bottom-up ratio can be defined as b/a, according to which the greater the bottom-up ratio is the more entirely the via hole becomes filled with copper, in other words, the higher bottom-up performance is achieved.

A filling defect of copper in a central portion of a wafer becomes particularly prominent in case where the plating growth is inhibited by oxidation of the seed layer or impurity such as an organic substance that has adhered thereto. This is because an increase of a resistance on the way from an edge to a center of the wafer further lowers an effective voltage in a central portion of the wafer, thereby enlarging the unfavorable influence originating from a drop of a voltage applied between the wafer and the anode. Accordingly, the copper layer does not sufficiently grow in a central portion of the wafer during an initial stage of the plating process, resulting in a poorer filling performance of copper in the via hole compared with a border region of the wafer. Besides, an increase of wafer dimensions and reduction in thickness of a seed layer due to a progress in micronization further increase a resistance from an edge to a center of the wafer, thereby degrading a copper filling efficiency in a central region of the wafer.

Also, because of a difference in bottom-up performance between a border region and a central region of a wafer, in-plane uniformity of a copper layer thickness is impaired.

Further, in case where an electrolytic plating apparatus is provided with a plurality of plating baths, variation of a current value among the plating baths may affect a growth rate of copper in an initial stage of the plating process. This comes from the method of supplying a current based on a voltage control because a current value cannot be monitored, when dipping wafers in the plating solution. Here, since a current value in such a case is very small the variation of the current value among the plating baths becomes relatively large, and resultantly a difference in bottom-up performance and copper filling efficiency among the plating baths becomes more prone to be produced.

SUMMARY OF THE INVENTION

The present invention has been conceived to solve the foregoing problems incidental to the prior art, with an object to provide a method of manufacturing a semiconductor device that improves filling performance of a conductive layer to be formed by an electrolytic plating process in an interconnect trench or a via hole, and achieves a higher in-plane uniformity in bottom-up performance.

According to the present invention, there is provided a method of manufacturing a semiconductor device comprising performing an electrolytic plating process to fill with a conductive layer at least one of an interconnect trench and a via hole formed in a dielectric layer on a semiconductor substrate, wherein the electrolytic plating process comprises a first step of executing a plating operation under a predetermined integrated current density, which is a product of a current density representing a current value supplied per unit area of a plating solution containing a material which constitutes the conductive layer and a plating time, and a second step of executing a plating operation under a lower current density than that of the first step.

According to the present invention, a plating operation is first executed for a predetermined duration of time under a current that can improve bottom-up performance, and then the plating operation is performed under a current that can decrease a defect rate of the conductive layer. Since the integrated current density is controlled so as not to exceed a predetermined value in the first step of plating operation, a conductive layer is formed with better filling performance and a decreased defect rate as a whole.

In the method of manufacturing a semiconductor device according to the present invention, the integrated current density may be set in a range of 0.01 to 0.1 A·sec/cm².

According to the present invention, with an integrated current density of 0.01 to 0.1 A·sec/cm², emergence of a defect in the conductive layer in the first step can be restrained.

Also, in the method of manufacturing a semiconductor device according to the present invention, a voltage to be applied to the plating solution in the first step may be a predetermined constant value.

According to the present invention, even though it is impossible to monitor a current being supplied to the plating solution in the first step, controlling a voltage at a predetermined value permits supplying a stabilized current to the plating solution.

Also, in the method of manufacturing a semiconductor device according to the present invention, the voltage may be applied to the plating solution prior to starting a plating operation in the first step.

According to the present invention, applying a predetermined voltage to the plating solution prior to the plating operation facilitates quickly starting the plating operation upon dipping the semiconductor substrate in the plating solution.

Also, in the method of manufacturing a semiconductor device according to the present invention, a value of the voltage may be set in a range of 1.59 to 3.83 mV/cm$^2$.

According to the present invention, setting a voltage value to be applied to the plating solution in a range of 1.59 to 3.83 mV/cm$^2$ results in supplying a current having a density of 4.77 to 19.2 mA/cm$^2$, taking a resistance value of the plating solution into account. Therefore, a conductive layer can be formed with better filling performance, and emergence of a defect in the conductive layer can be restrained.

Further, in the method of manufacturing a semiconductor device according to the present invention, a current density in the first step may be set in a range of 4.77 to 19.2 mA/cm$^2$.

According to the present invention, as a result of setting a current density in the first step in a range of 4.77 to 19.2 mA/cm$^2$, a conductive layer can be formed with better filling performance, and emergence of a defect in the conductive layer can be restrained.

Further, in the method of manufacturing a semiconductor device according to the present invention, a current density in the second step may be set at a predetermined constant value.

According to the present invention, setting a current density in the second step at a constant value permits formation of a uniform and dense conductive layer.

Still further, in the method of manufacturing a semiconductor device according to the present invention, a current density in the second step may be set in a range of 1.5 to 13 mA/cm$^2$.

According to the present invention, setting a current density in the second step in a range of 1.5 to 13 mA/cm$^2$ permits securing a throughput of the plating process, and restraining emergence of a defect in the conductive layer.

With the foregoing constitution, the present invention offers the following advantages.

According to the present invention, executing a plating operation for a predetermined duration of time under a high current in the first step of the electrolytic plating process allows sufficient growth during an initial stage of the plating process even in a central region of the semiconductor substrate where an effective voltage becomes lower. Therefore, bottom-up performance can be improved so that a better filling performance of a conductive layer can be achieved.

Also, since an operation time of the step performed under a high current is short and a substantial portion of a conductive layer is therefore formed under a low current, emergence of a defect in a subsequent CMP process can be restrained.

Also, only a small difference in bottom-up performance is produced between a border region and a central region of a semiconductor substrate. Accordingly, uniformity in film thickness of a conductive layer formed on a semiconductor substrate is improved.

Further, even in case where a plurality of plating baths are involved, since the first step is performed under a high current, a variation in current value among plating baths can be absorbed. As a result, a difference in bottom-up performance as well as in filling performance among plating baths is reduced.

DETAILED DESCRIPTION OF THE INVENTION

A method of manufacturing a semiconductor device according to the present invention features an electrolytic plating process, which includes a first step performed under a condition appropriate for improving bottom-up performance, and a second step performed under a condition appropriate for restraining a defect that may appear after a CMP process.

Hereunder, embodiments of the present invention will be described referring to the accompanying drawings. In the following passages, similar constituents will be given an identical numeral, and description thereof will be omitted as the case may be.

Figure 1:
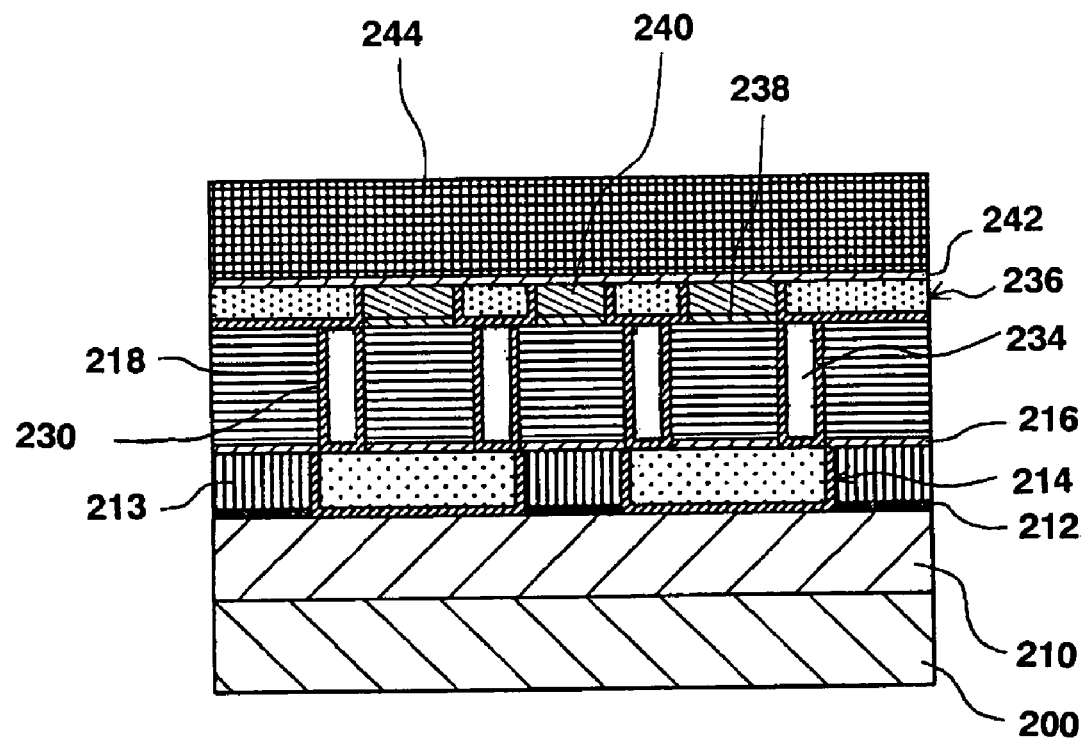
FIG. 1 is a schematic cross-sectional view showing a constitution of a semiconductor device according to an embodiment of the present invention.

FIG. 1 is a schematic cross-sectional view showing a constitution of a semiconductor device. Here, a constitution of a semiconductor element is not shown in the drawing.

As shown in FIG. 1, the semiconductor device is provided with a first interconnect 214 formed on an underlying dielectric layer 210 provided on a semiconductor substrate 200, a second interconnect 236 isolated from the first interconnect 214 by a second interlayer dielectric layer 218, and a via 234 which electrically connects the first interconnect 214 and the second interconnect 236.

The first interconnect 214 is formed in a first etch-stopper layer 212 and a first interlayer dielectric layer 213. The via 234 is disposed in a second etch-stopper layer 216 and a second interlayer dielectric layer 218. The second interconnect 236 is formed in a third etch-stopper layer 238 and a third interlayer dielectric layer 240.

An upper face of the second interconnect 236 is covered with a metal diffusion barrier 242 which prevents diffusion of a metal contained in the interconnect. Over the second interconnect 236, a bonding pad (not shown in the drawings) for electrical connection to outside the semiconductor device and a protection layer 244 for preventing intrusion of moisture are provided.

To form the interconnect and the via the Damascene process is known, which includes filling an interconnect trench or a via hole with a conductive layer containing a metal such as copper (Cu), and scraping an excessive portion of the conductive layer by a CMP (Chemical Mechanical Polishing) process. In this embodiment, an electrolytic plating process is employed as a part of the Damascene process, for filling an interconnect trench or a via hole with a conductive layer. The electrolytic plating process will be described below.

Figure 2:
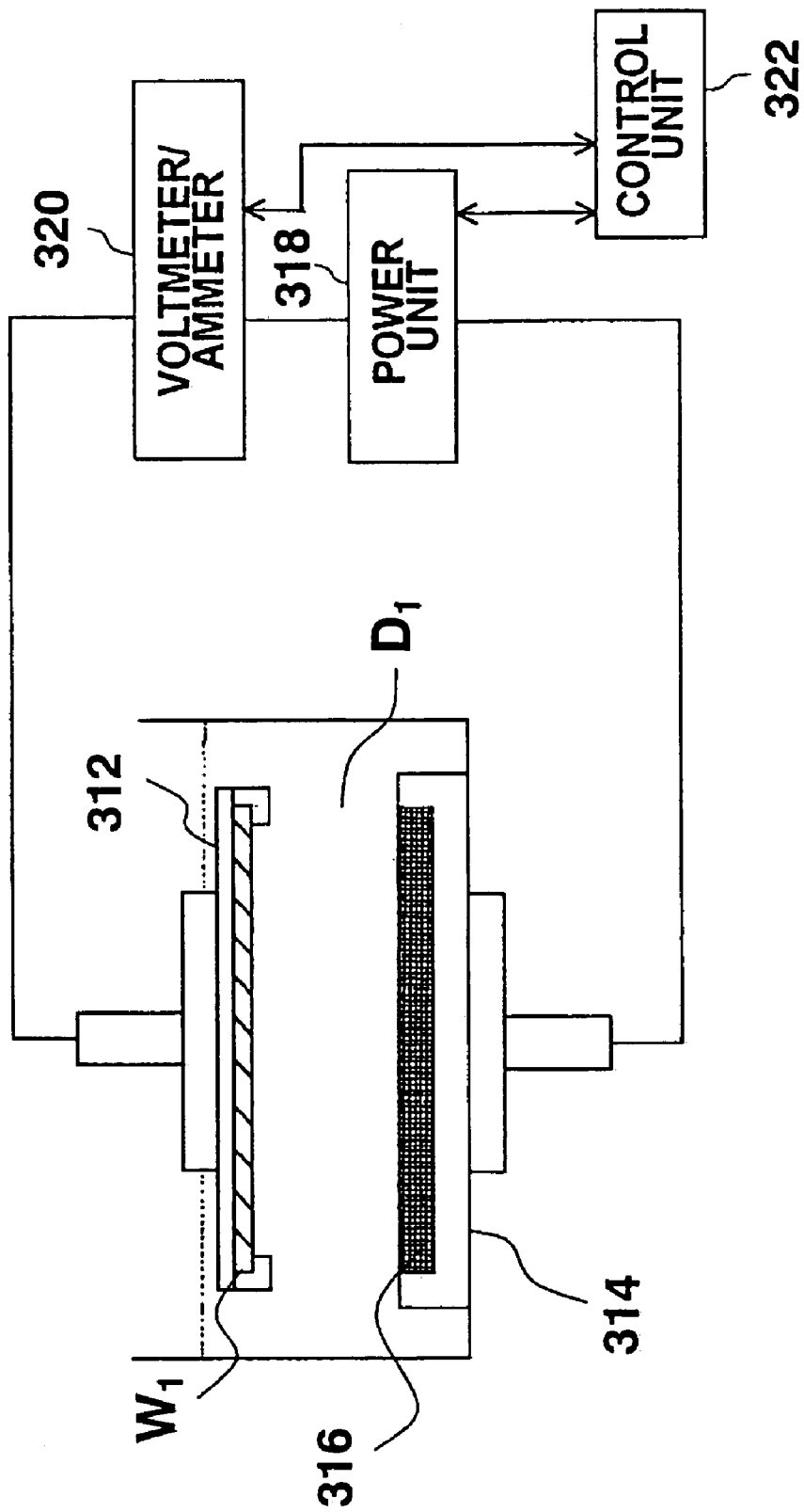
FIG. 2 is a block diagram showing a constitution of an electrolytic plating apparatus according to the embodiment.

FIG. 2 is a block diagram showing a constitution of an electrolytic plating apparatus employed for the electrolytic plating process. In the subsequent passages, not only an independent piece of semiconductor substrate constituted of silicon or gallium arsenide, but also a semiconductor substrate on which a semiconductor element or an interconnect is formed will be collectively defined as a wafer. Also, the electrolytic plating apparatus will be employed to form a copper layer.

As shown in FIG. 2, the electrolytic plating apparatus is provided with a wafer holder 312 for holding a wafer $W_1$ to be plated, a plating bath 314 in which a plating solution $D_1$ is deposited, an anode 316 set so as to confront the wafer $W_1$ which acts as a cathode, a power unit 318 for applying a predetermined voltage and supplying a predetermined current between the wafer $W_1$ and the anode 316, a voltmeter/ammeter 320 for measuring a voltage and a current between the wafer $W_1$ and the anode 316, and a control unit 322 which controls a current to be supplied between the wafer $W_1$ and the anode 316 as well as a voltage to be applied between the wafer $W_1$ and the anode 316 at a predetermined constant value. The electrolytic plating apparatus is also provided with a carrier robot (not shown in the drawings), which attaches the wafer $W_1$ to the wafer holder 312 and dips it in the plating solution $D_1$, and then removes the wafer $W_1$ from the wafer holder 312 after completion of the plating process. The plating solution $D_1$ is, for example, copper sulfate containing a trace of additive.

The wafer $W_1$ to be plated is provided with a barrier metal layer and a copper seed layer, formed in this sequence on a predetermined opening pattern on a dielectric layer surface. When an operator places such wafer $W_1$ on a designated inlet/outlet gate, the carrier robot (not shown in the drawings) of the electrolytic plating apparatus attaches the wafer $W_1$ to the wafer holder 312 and dips it in the plating solution $D_1$. Thereafter, the control unit 322 monitors a value of the voltmeter/ammeter 320 to control the power unit 318 such that a predetermined current is supplied between the wafer $W_1$ and the anode 316, by which a copper-plated layer is formed on the opening pattern.

A method of manufacturing the above semiconductor device will be described.

FIGS. 3A to 3C and 4D to 4F are schematic cross-sectional views progressively showing a method of manufacturing the semiconductor device. Here, it is to be construed that the semiconductor substrate is provided with semiconductor elements though they are not shown in the drawings, and such elements will not be particularly referred to in the following description.

Figure 3A:
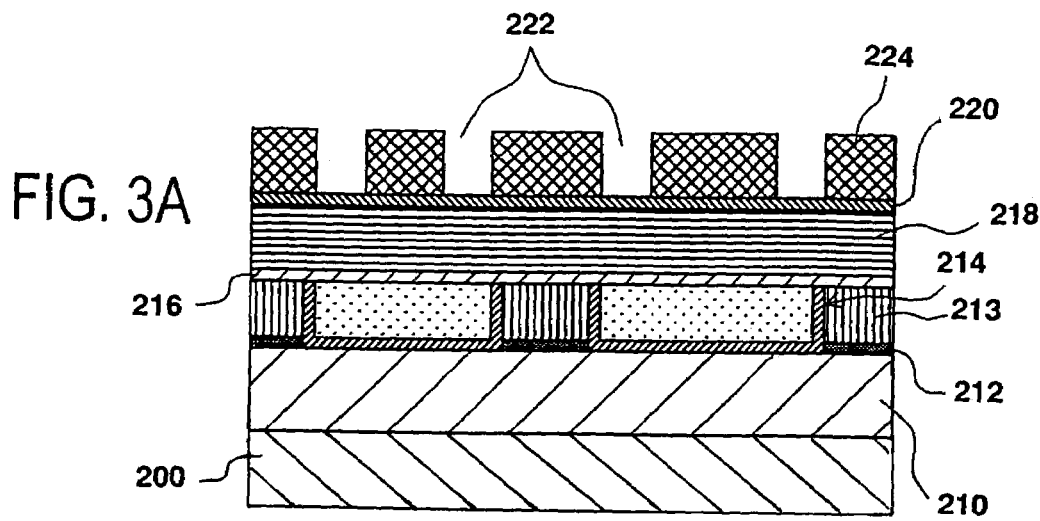
FIGS. 3A to 3C are schematic cross-sectional views progressively showing a method of manufacturing the semiconductor device of FIG. 1.

After forming a semiconductor element (not shown in the drawings) on the semiconductor substrate 200 shown in FIG. 1, the underlying dielectric layer 210 is formed. The first etch-stopper layer 212 and the first interlayer dielectric layer 213 for insulating the first interconnect 214 are formed on the underlying dielectric layer 210. Then a known lithography and etching process is carried out to form a predetermined first trench pattern in the first etch-stopper layer 212 and the first interlayer dielectric layer 213, after which the first trench pattern is filled with a conductive layer, and the first interconnect 214 is formed through the Damascene process. Thereafter, a second etch-stopper layer 216 is formed over an upper face of the first interconnect 214, and then the second interlayer dielectric layer 218 and an anti-reflection layer 220 are sequentially formed. Then a known lithography process is carried out to form a resist 224 having a via hole pattern 222 (FIG. 3A).

Figure 3B:
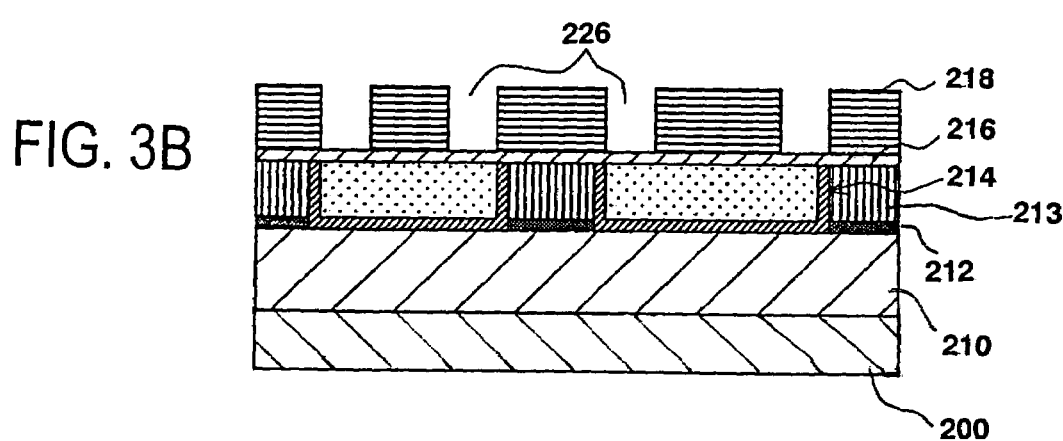

Referring to FIG. 3B, anisotropic etching is performed to remove a portion of the anti-reflection layer 220, the second interlayer dielectric layer 218 and the second etch-stopper layer 216 that is not covered with the resist 224, to thereby form a via hole 226. Thereafter the resist 224 and the anti-reflection layer 220 are removed by ashing and a stripper.

Figure 3C:
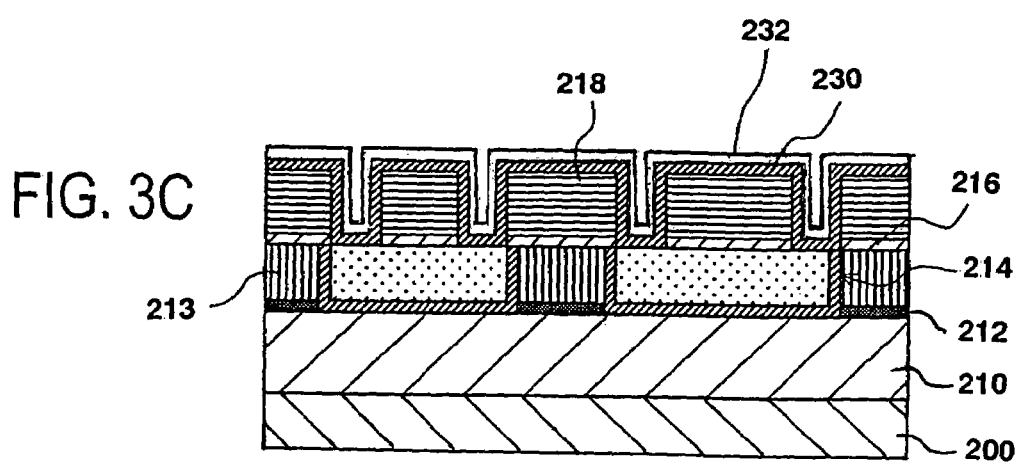

Then referring to FIG. 3C, a barrier metal layer 230 containing tantalum is formed on an upper face of the second interlayer dielectric layer 218 and on the via hole 226 to prevent diffusion of copper. After that, a copper seed layer 232 is formed as a base of plating growth of copper. Then the wafer $W_1$ is loaded on the electrolytic plating apparatus shown in FIG. 2, and a current of a predetermined current density is supplied between the wafer $W_1$ and the anode 316 so that the plating process is performed.

Figure 4D:
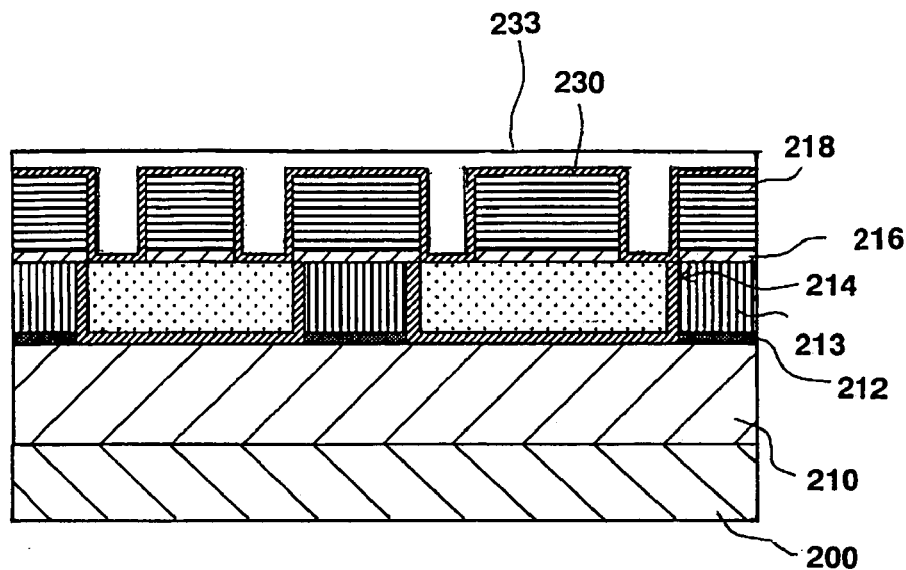
FIGS. 4D to 4F are schematic cross-sectional views progressively showing a method of manufacturing the semiconductor device of FIG. 1.
Figure 4E:
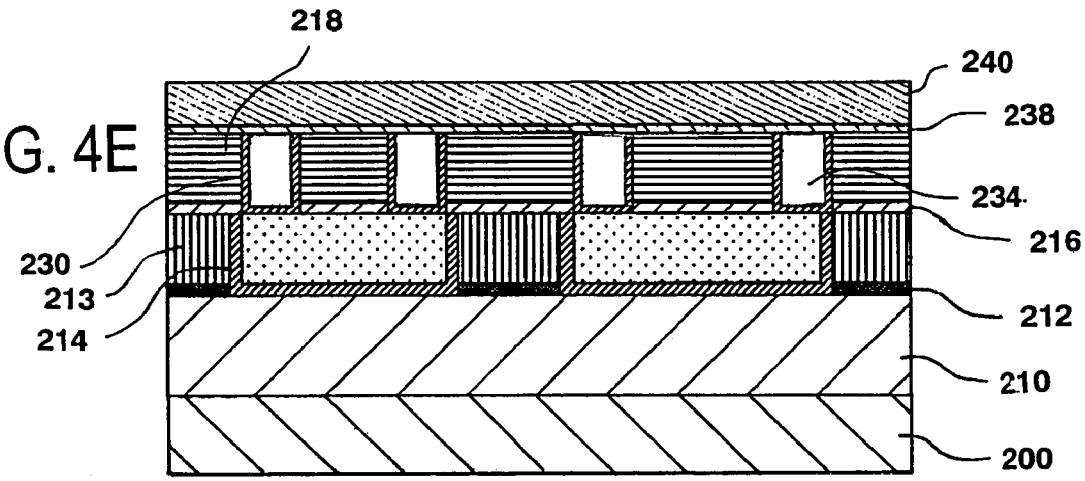

Through such plating process, a copper layer 233, in which the copper seed layer 232 has been merged, is formed as shown in FIG. 4D. Then a CMP process is performed to polish the copper layer 233 and the barrier metal layer 230 until an upper face of the second interlayer dielectric layer 218 is exposed, to thereby form a via 234. Thereafter a third etch-stopper layer 238 is formed to cover an upper face of the via 234, and a third interlayer dielectric layer 240 is formed (FIG. 4E).

Figure 4F:
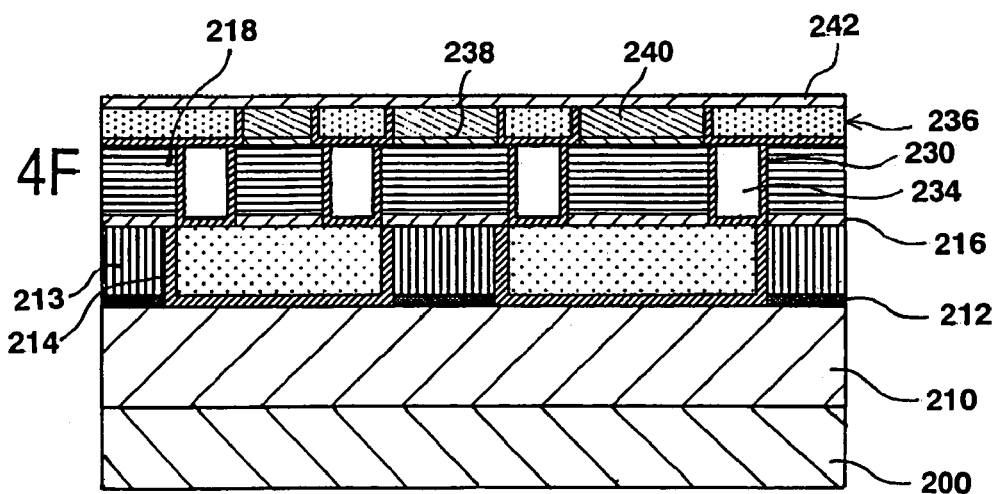

Referring to FIG. 4F, the Damascene process is carried out as with the first interconnect 214, to form a second interconnect 236 constituted of a conductive layer filled in a predetermined second trench pattern formed on the third etch-stopper layer 238 and the third interlayer dielectric layer 240. Then a metal diffusion barrier 242 is formed over the second interconnect 236, after which a bonding pad (not shown in the drawings) is formed and then the protection layer 244 shown in FIG. 1 is formed.

Figure 5A:
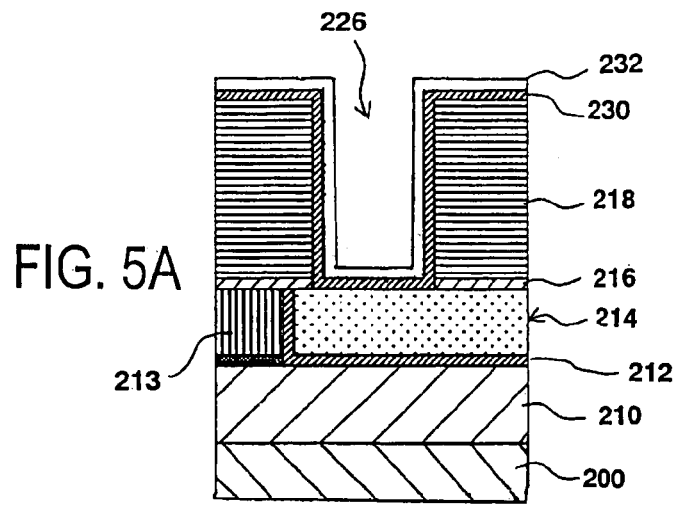
FIGS. 5A to 5C are enlarged schematic cross-sectional views progressively showing a method of manufacturing the semiconductor device according to the embodiment.
Figure 5B:
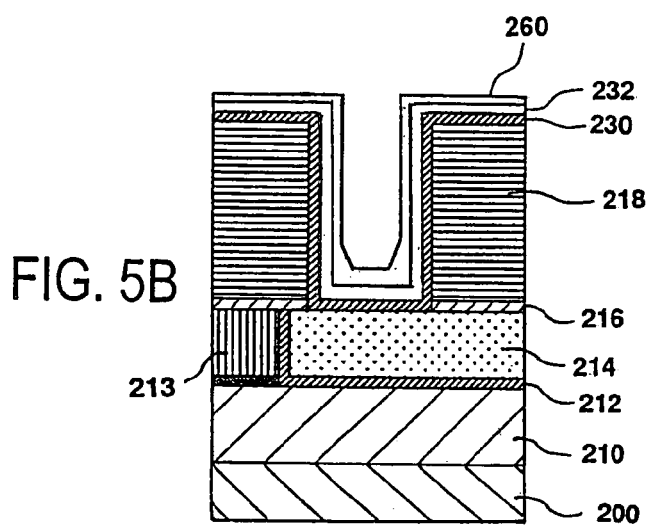
Figure 5C:
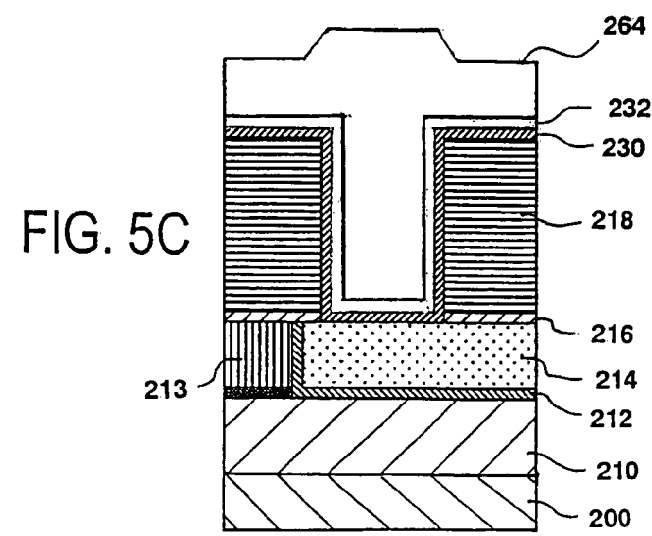

FIGS. 5A to 5C are enlarged schematic cross-sectional views showing a portion around the via hole 226 formed through the steps of FIGS. 3A to 4F. Hereafter, formation of the via will be described in details.

Referring to FIG. 5A, after forming a semiconductor element (not shown in the drawings) on the semiconductor substrate 200, the barrier metal layer 230 and the copper seed layer 232 are formed on the via hole 226 located on the first interconnect 214 on the underlying dielectric layer 210 formed on the semiconductor substrate 200. Then the wafer $W_1$ (FIG. 2) is attached to the wafer holder 312 (FIG. 2) of the electrolytic plating apparatus and the plating process including the following two steps is carried out.

Figure 14:
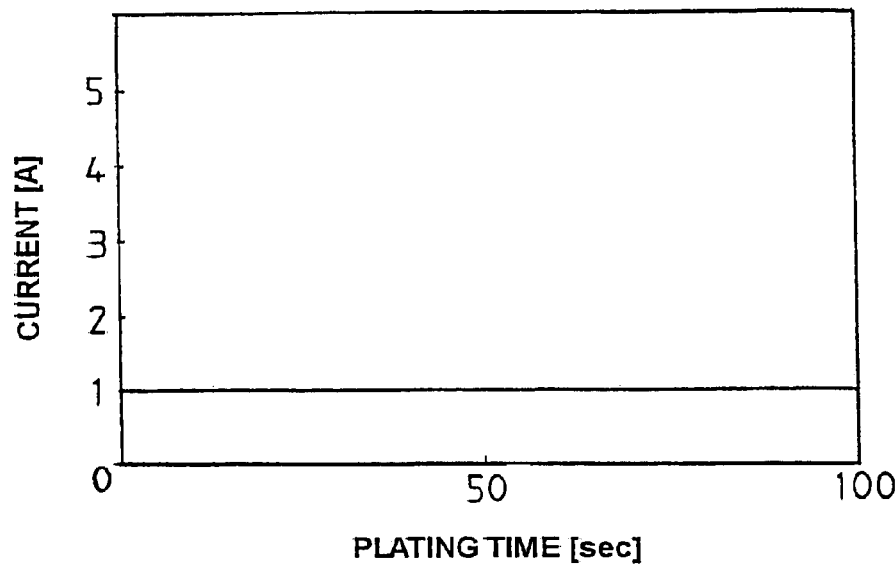
FIG. 14 is a line graph showing an operation time and a current value in an electrolytic plating process.
Figure 15:
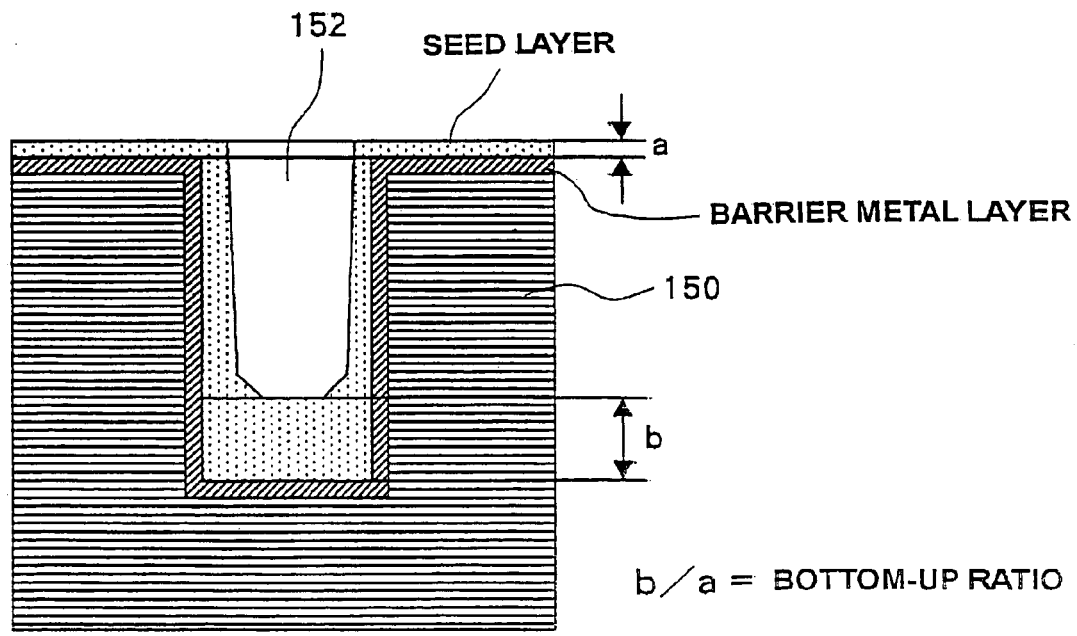
FIG. 15 is a schematic cross-sectional view showing a constitution of a via hole for explaining bottom-up performance.

In the first step, a voltage applied between the wafer $W_1$ and the anode 316 is controlled such that a current density, which is a value of current supplied per unit area of a plating solution between the wafer $W_1$ and the anode 316, becomes greater than a value of the prior art shown in FIG. 14. Such current is supplied for a predetermined time, so that a first copper-plated layer 260 is formed (FIGS. 5B and 6).

Then in the second step a current having a smaller current density than in the first step is supplied for a predetermined time to thus form a second copper-plated layer. At this stage a copper-plated layer 264 including the first copper-plated layer 260 and second copper-plated layer (FIGS. 5C and 6). Thereafter, a CMP process is performed as in the prior art, so that a via is formed.

Figure 6:
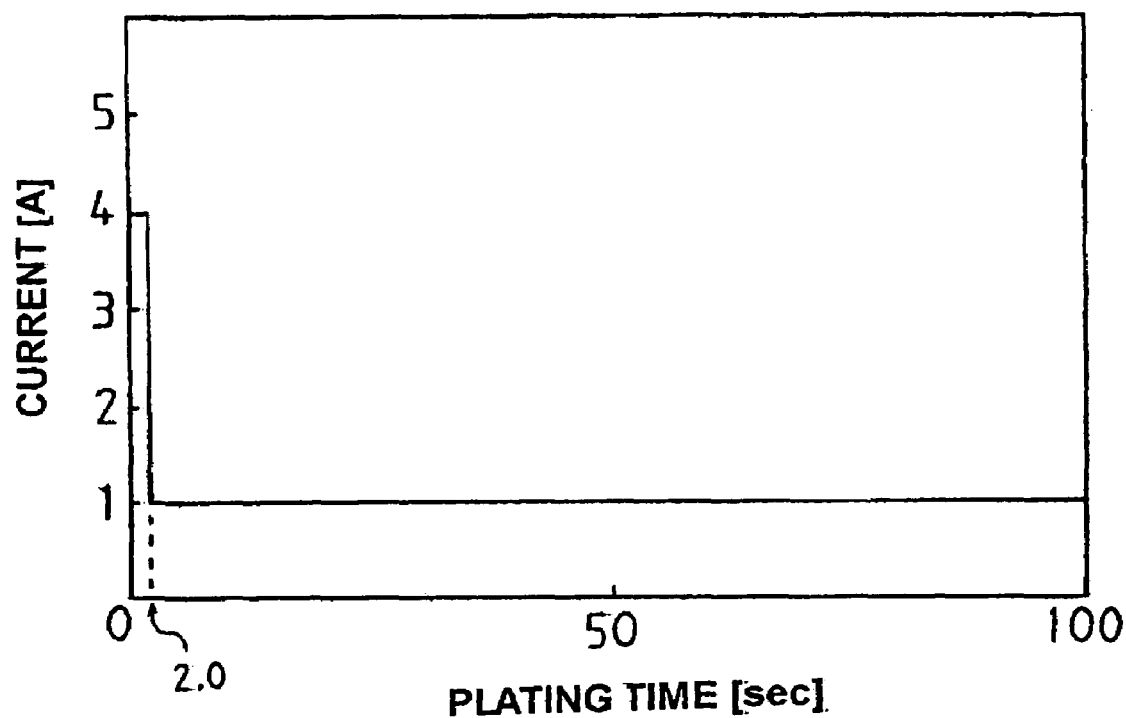
FIG. 6 is a line graph showing an operation time and a current value in the first step according to the embodiment.

FIG. 6 is a line graph showing a current between the wafer and the anode during the formation of the copper-plated layer. The horizontal axis represents a duration of time after starting the plating operation, and the vertical axis represents a current value.

As shown in FIG. 6, in the first step the plating operation is performed, for example, under a current value of 4.0 A for 2 seconds, and in the second step, for example, under a current value of 1.0 A for 98 seconds. In the first step, a greater current than in the second step is supplied for forming the copper-plated layer, for the purpose of improving a bottom-up ratio. In the second step, a smaller current than in the first step is supplied for forming the copper-plated layer, to thereby restraining emergence of a defect in a subsequent CMP process. Also, maintaining the current amount at a constant level in the respective steps permits formation of a uniform and dense copper-plated layer.

Now, outcome of detailed studies on the conditions in the first step will be described.

To start with, a relation between an integrated current density, which is a product of a current density and a plating time, and the number of defects of a copper layer will be described.

Figure 7:
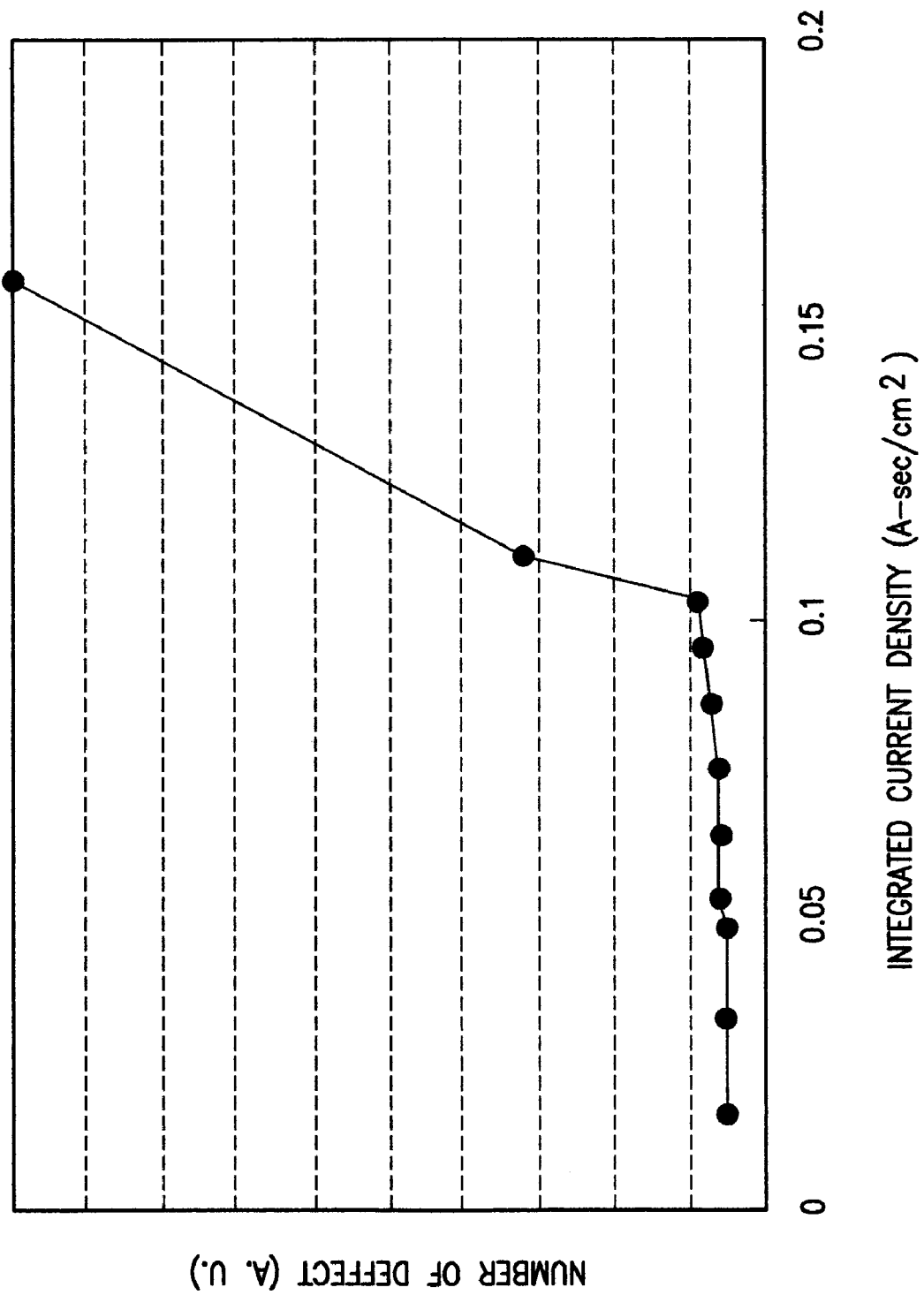
FIG. 7 is a line graph showing a relation between an integrated current density and the number of defects in the first step according to the embodiment.

FIG. 7 is a line graph showing a relation between an integrated current density and the number of defects in the first step. The horizontal axis represents an integrated current density in the first step. The vertical axis represents a magnitude of the number of defects that have emerged during a CMP process after filling a via hole with a copper layer. Here, the foregoing second step has been carried out after the first step, in which a same condition was applied in the second step, in all the cases.

As is apparent in view of FIG. 7, the number of defects remains substantially constant in an integrated current density range of 0.01 to 0.1 amp·sec/cm$^2$ (hereinafter the unit will be denoted as "A·sec/cm$^2$"), while in a range exceeding 0.1 A·sec/cm$^2$ the number of defects is sharply increasing. This proves that it is appropriate to set the integrated current density at not greater than 0.1 A·sec/cm$^2$ in the first step of copper-plated layer formation, in order to restrain the emergence in a CMP process after formation of a copper layer.

On the other hand, in case where an additive contained in the plating solution $D_1$ is not uniformly adsorbed on a copper-plated layer in the first step, a plating growth may not be uniformly take place in the second step. Accordingly, it is necessary to form at least an atom layer (monolayer) on the copper seed layer 232 in the first step. Setting the integrated current density at 0.01 A·sec/cm$^2$ enables formation of two monolayers uniformly over the copper seed layer 232, therefore an upper face of the copper seed layer 232 is sufficiently coated with the first copper-plated layer 260, so that the additive can effectively act.

Based on the above, it has been proven that a preferable integrated current density in the first step is in a range of 0.01 to 0.1 A·sec/cm$^2$.

Now, description will be given on the number of defects in a copper layer and bottom-up performance, with respect to a current density in the first step.

Figure 8:
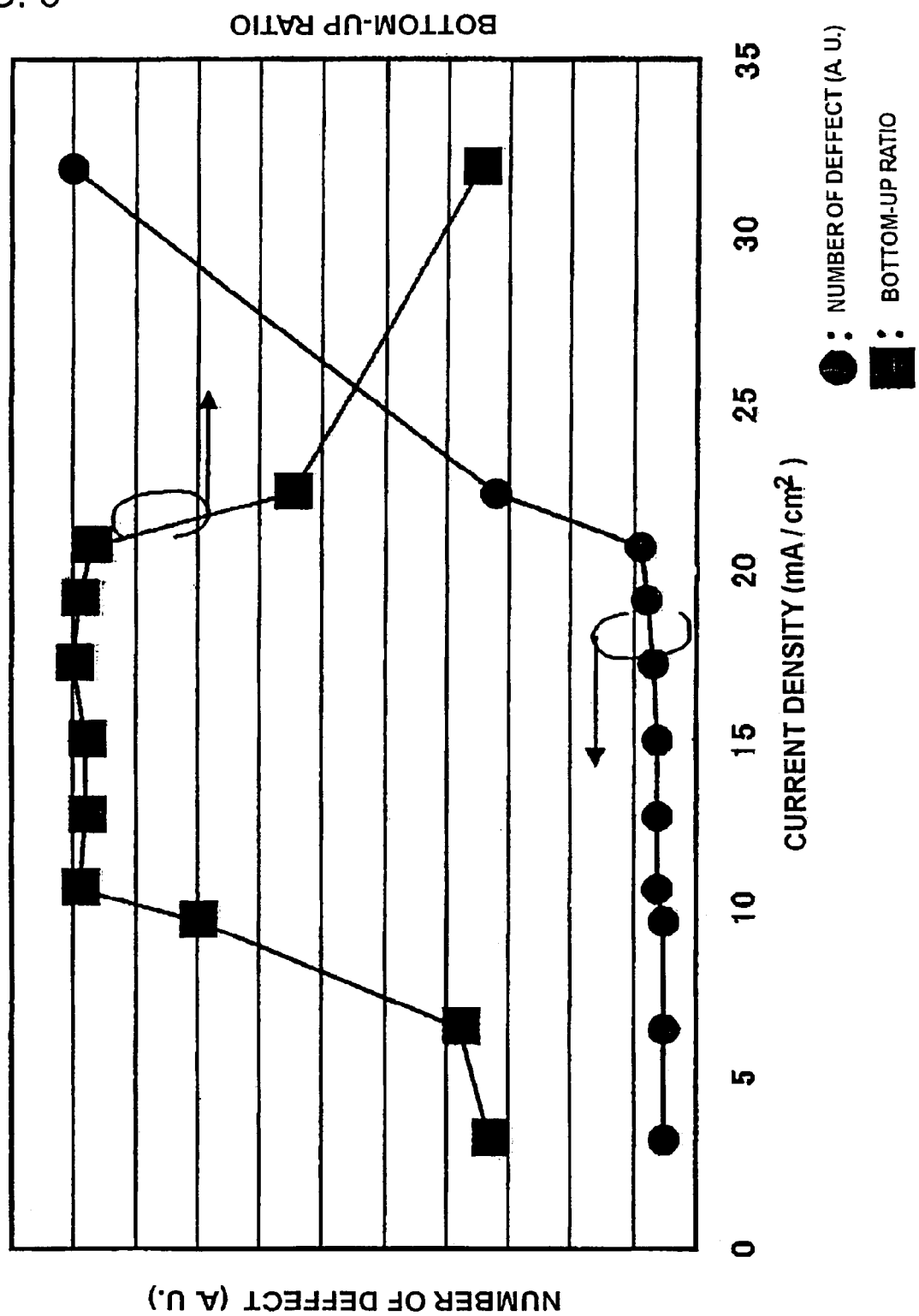
FIG. 8 is a line graph showing the number of defects and a bottom-up ratio with respect to a current density in the first step according to the embodiment.

FIG. 8 is a line graph showing the number of defects in a copper layer and a bottom-up ratio with respect to a current density in the first step. The horizontal axis represents a current density of a current supplied in the plating solution $D_1$ (FIG. 2) between the wafer $W_1$ and the anode 316 of the apparatus shown in FIG. 2. The left side vertical axis represents the number of defects in a copper layer after a CMP process as in FIG. 7, and the right side vertical axis represents a bottom-up ratio.

In view of the relation between a current density and the number of defects in a copper layer shown in the graph of FIG. 8, it is apparent that it is appropriate to set a current density at not greater than 19.2 mA/cm$^2$.

Also in view of the relation between a current density and a bottom-up ratio shown in the graph of FIG. 8, the bottom-up ratio increases when a current density exceeds 4.77 mA/cm$^2$, becomes substantially constant in a range of approx. 10 to 20 mA/cm$^2$, and drops in a range higher than approx. 20 mA/cm$^2$. This proves that it is appropriate to set a current density in the first step in a range not less than 4.77 mA/cm$^2$ but not greater than 20 mA/cm$^2$.

As a result, it has been proven that a preferable range of a current density in the first step is 4.77 mA/cm$^2$ to 19.2 mA/cm$^2$.

To summarize the results shown in FIGS. 7 and 8, a preferable current density in the first step is in a range of 4.77 to 19.2 mA/cm$^2$, and a preferable integrated current density is in a range of 0.01 to 0.1 A·sec/cm$^2$. In case where, for example, a current density is set at 4.77 mA/cm$^2$ and an integrated current density at 0.01 A·sec/cm$^2$ in the first step, an operation time in the first step may preferably be approx. 2.1 seconds.

Meanwhile, a stabilized current cannot be obtained between the wafer $W_1$ and the anode 316 when dipping the wafer $W_1$ in the plating solution $D_1$. Accordingly, the control unit 322 of the electrolytic plating apparatus may control a voltage to be applied between the wafer $W_1$ and the anode 316 such that a current value remains constant, instead of directly controlling the current, in an initial stage of the first step. In this case, it is preferable to set a voltage at a constant value in a range of 1.59 to 3.83 mV/cm$^2$ such that a current density in the first step remains within a range of 4.77 to 19.2 mA/cm$^2$, in consideration of a resistance value of the plating solution $D_1$.

Also, a predetermined voltage may be applied in advance to the plating solution $D_1$ prior to dipping the wafer $W_1$ therein, so that the operation of the first step can be quickly started upon dipping the wafer $W_1$ in the plating solution $D_1$.

Further, it is preferable to set a current density in the second step at a predetermined constant value within a range of 1.5 to 13 mA/cm$^2$, in order to restrain emergence of a defect in a CMP process and securing a desired throughput.

Now, an in-plane difference in bottom-up performance with respect to a prior art will be described.

Figure 9:
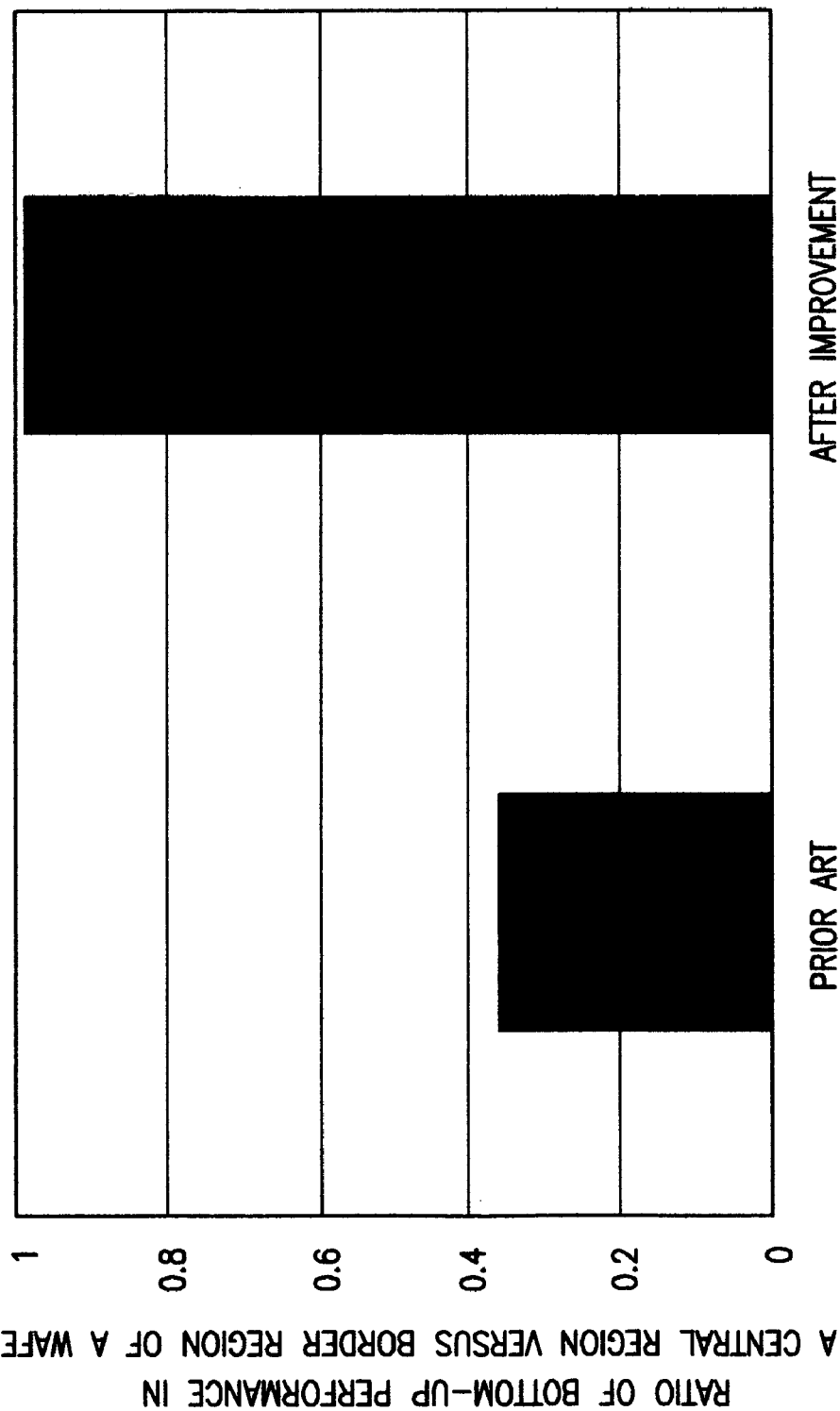
FIG. 9 is a bar graph showing an in-plane difference in bottom-up ratio between a prior art and the method according to the embodiment.
Figure 10:
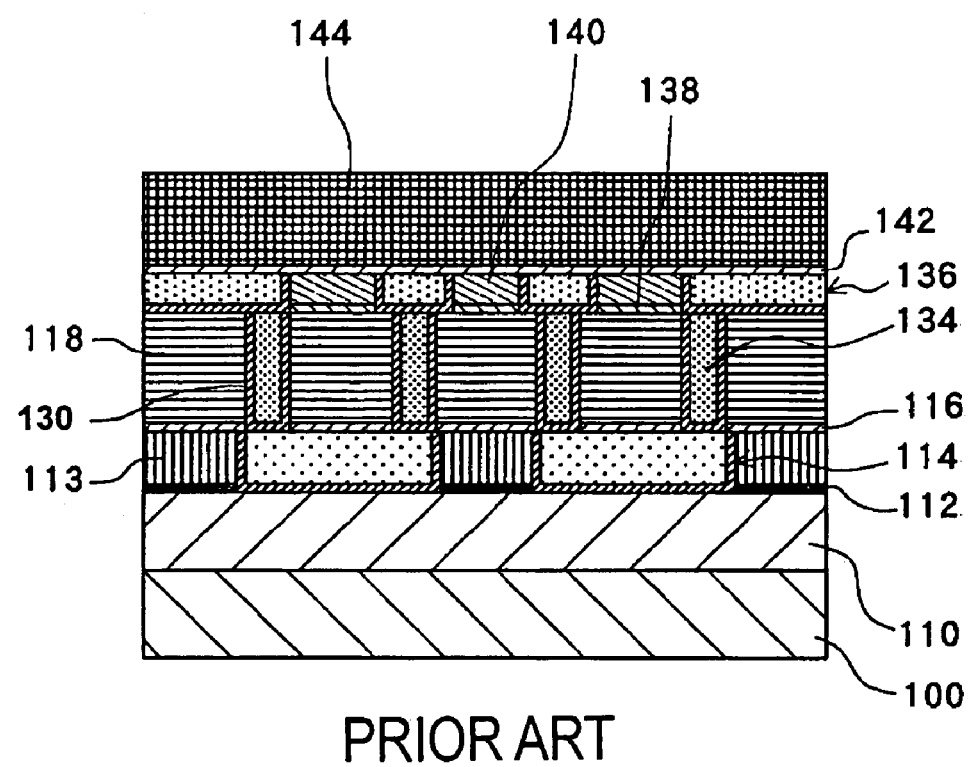
FIG. 10 is a schematic cross-sectional view showing a constitution of a semiconductor device according to a prior art.
Figure 11:
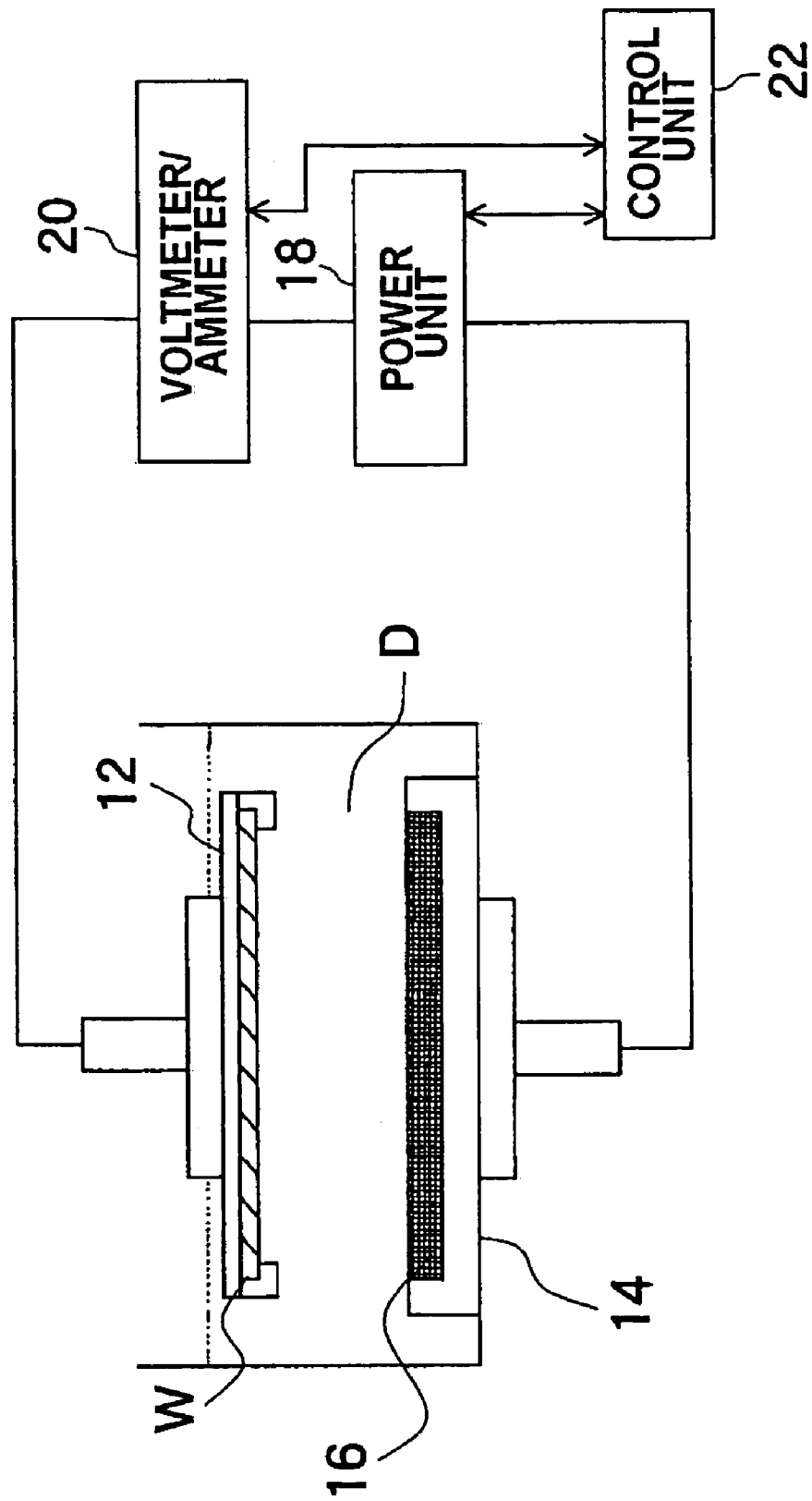
FIG. 11 is a block diagram showing a constitution of an electrolytic plating apparatus.
Figure 12A:
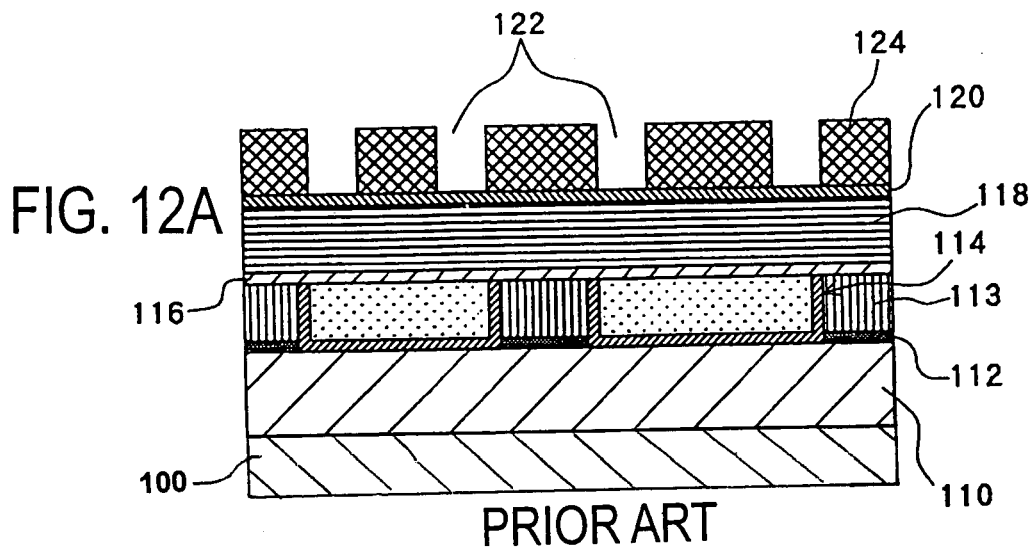
FIGS. 12A to 12C are schematic cross-sectional views progressively showing a method of manufacturing the semiconductor device of FIG. 10.
Figure 12B:
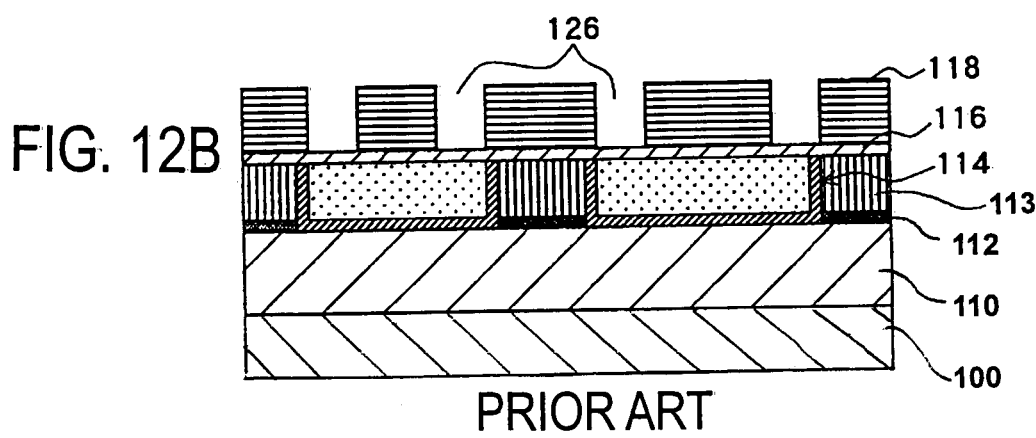
Figure 12C:
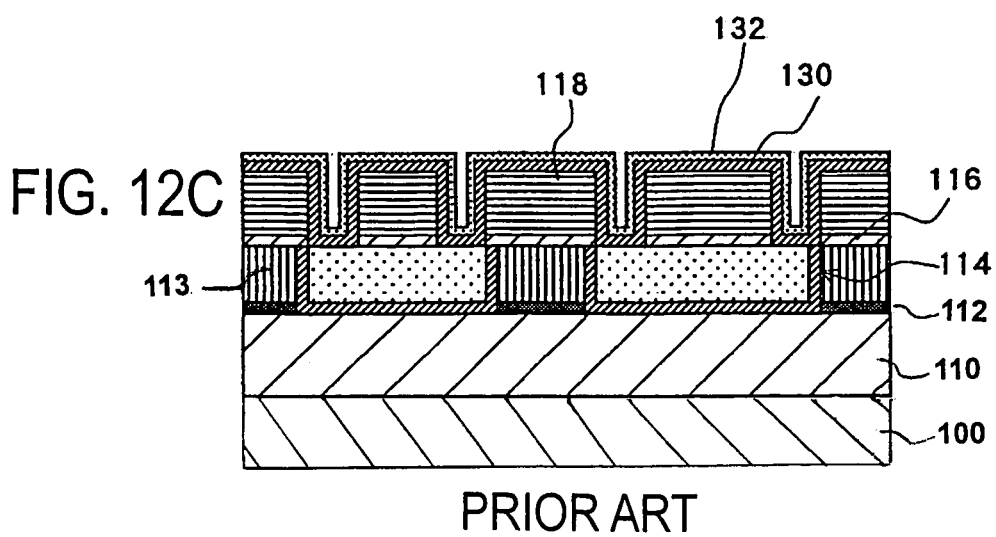
Figure 13D:
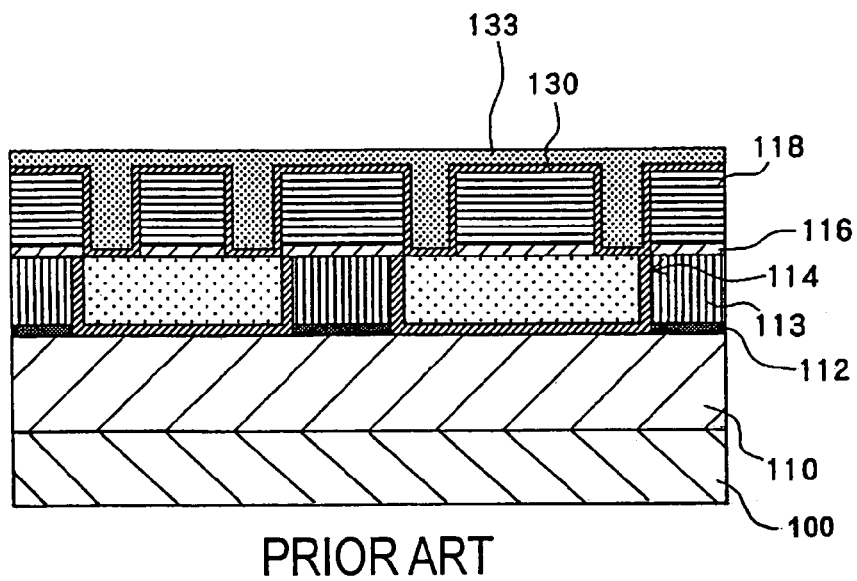
FIGS. 13D to 13F are schematic cross-sectional views progressively showing a method of manufacturing the semiconductor device of FIG. 10.
Figure 13E:
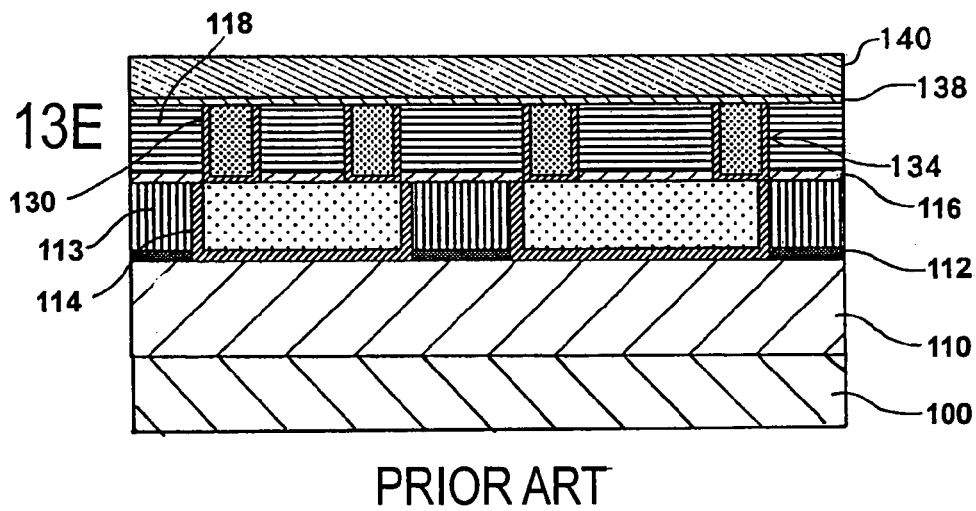
Figure 13F:
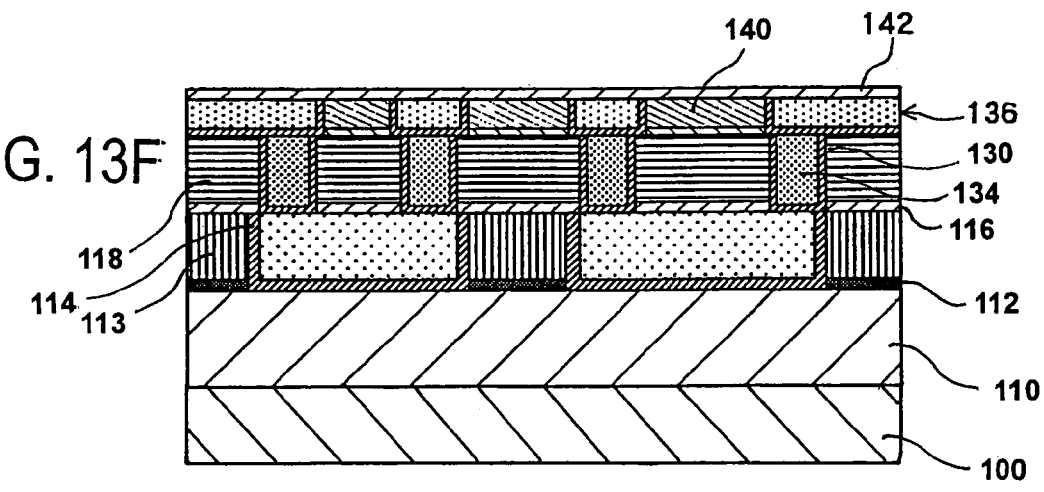

FIG. 9 is a bar graph showing an in-plane difference in bottom-up ratio between a prior art and the method according to this embodiment. "After improvement" on the horizontal axis represents the case according to this embodiment. The vertical axis represents a ratio of bottom-up performance in a central region of a wafer with respect to that of a border region thereof. Such ratio is hereinafter referred to as a "bottom-up performance ratio".

As shown in FIG. 9, while a bottom-up performance ratio is approx. 0.4 by the prior art, that of this embodiment is approx. 1.0. In view of this, it is proven that substantially the same level of bottom-up performance is achieved in a border region and a central region of a wafer, in the case of this embodiment.

Hereunder, a method of manufacturing the semiconductor device according to this embodiment will be described.

As shown in FIG. 14, according to a prior art as represented by the above-cited JP-A Laid Open No. 1999-097391, a wafer is dipped in a plating solution with a constant voltage being applied between electrodes. Therefore, a growth during an initial stage of the plating process is insufficient in a central region of the wafer, where an effective voltage drops, because of which it is difficult to improve bottom-up performance. On the contrary, according to this embodiment as described above, a wafer is dipped in a plating solution with a high voltage being applied between electrodes, so that a higher current is supplied in the first step compared with the second step. As a result, even in a central region of the wafer where an effective voltage drops, a sufficient growth is achieved during an initial stage of the plating process, thereby improving bottom-up performance and achieving better filling performance of a copper-plated layer.

Also, an operation time of the first step during which a high current is supplied is short, and a substantial part of a copper-plated layer is grown by plating at a low current. Accordingly, emergence of a defect after a CMP process can be restrained.

Also, supplying a higher current in the first step by dipping a wafer in a plating solution with a high voltage being applied between electrodes permits a sufficient growth during an initial stage of the plating process, even in a central region of the wafer where an effective voltage drops. Accordingly, since a difference in bottom-up performance between a border region and a central region of the wafer is reduced, uniformity of a film thickness of a copper layer formed on the wafer surface can be improved.

Further, referring to an electrolytic plating apparatus provided with a plurality of plating baths, in case where a current value is low when dipping a wafer in a plating solution in the first step, a variation of a current value among the plating baths becomes relatively large. However, when a current value in the first step is sufficiently high, the variation of the current value among the plating baths becomes relatively small. Accordingly, a difference in filling performance and bottom-up performance among the plating baths also becomes small. Such advantage also applies to a plurality of plating sessions executed in a same plating bath.

Although the present invention has been described by way of exemplary embodiments along with the accompanying drawings, it should be understood that many changes and substitutions may further be made by those skilled in the art without departing from the scope of the present invention.

To cite a few examples, while the foregoing embodiment includes two steps in an electrolytic plating process, the electrolytic plating process may include three or more steps. In case where a current direction in the first step and the second step is defined as forward direction, a third step may be added where, for example, a current is supplied in a reverse direction to remove an additive in the plating solution from a surface of the copper-plated layer, and a fourth step may further be executed, in which a current is supplied in a forward direction to grow the copper-plated layer.

Also, while the foregoing embodiment refers to formation of a via, the method of manufacturing a semiconductor device according to the embodiment may be applied to formation of an interconnect. Further, the method may be applied to a dual Damascene process of forming a via and an interconnect at a time, without limiting to a single Damascene process of forming either a via or an interconnect.

Further, while the foregoing embodiment refers to a two-level interconnect including a first interconnect and a second interconnect, the method may be applied to an interconnect structure including three or more layers.

Further, a copper-alloy seed layer containing at least an additional element may be employed instead of the copper seed layer referred to above. For example, tin, titanium, aluminum and so on, may be used as the additional element. Despite that a resistance value may increase owing to such additional element, insufficient filling of copper in a central region of a wafer can equally be restrained by the advantageous features of the method of manufacturing a semiconductor device according to the embodiment as described above.

What is claimed is:

1. A method of manufacturing a semiconductor device, comprising:

performing an electrolytic plating at a first current density to partially fill at least one of an interconnect trench and a via with a conductive layer;

immediately thereafter, performing a second electrolytic plating at a lower current density than that of said first current density to completely fill said at least one of said trench and said via.

2. The method as set forth in claim 1, wherein said first current density is in a range of 4.77 to 11.2 mA/cm$^2$.

3. The method as set forth in claim 2, wherein said second current density is in a range of 1.5 to 13 mA/cm$^2$.

4. The method as set forth in claim 1, wherein said performing an electrolytic plating at a first current density is performed for a first time period and said performing an electrolytic plating is performed for a second time period that is greater than said first time period.

5. The method as claimed in claim 4, wherein said first time period is about two seconds and the second time period is about 98 seconds.

6. A method of manufacturing a semiconductor device comprising performing an electrolytic plating process to fill with a conductive layer at least one of an interconnect trench and a via hole formed in a dielectric layer on a semiconductor substrate, said electrolytic plating process, comprises:

performing an electrolytic plating at a first current density for a first period of time; and performing a second electrolytic plating at a lower current density than that of said first current density for a second period of time that is greater than said first period of time.

* * * * *